United States Patent

Brand

[11] Patent Number: 5,869,960
[45] Date of Patent: Feb. 9, 1999

[54] DIGITAL POWER CONSUMPTION METER FOR DISPLAYING INSTANTANEOUS AND CONSUMED ELECTRIC POWER OF AN ELECTRICAL DEVICE

[76] Inventor: Ethan Brand, 421 Hilton Rd., Whitefield, Me. 04353

[21] Appl. No.: 770,718

[22] Filed: Dec. 19, 1996

[51] Int. Cl.⁶ .................................................. G01R 21/06
[52] U.S. Cl. ........................................................ 324/142
[58] Field of Search .................................. 324/141, 142, 324/129, 127

[56] References Cited

U.S. PATENT DOCUMENTS

| | | | |
|---|---|---|---|
| 3,673,495 | 6/1972 | Riebs | 324/142 |
| 3,959,724 | 5/1976 | Chana | 324/142 |
| 4,055,803 | 10/1977 | Kraley et al. | 324/142 |
| 4,096,436 | 6/1978 | Cook | 324/142 |
| 4,120,031 | 10/1978 | Kincheloe | 364/464 |
| 4,131,847 | 12/1978 | Kohga et al. | 324/141 |
| 4,207,557 | 6/1980 | Gilkeson et al. | 324/142 X |
| 4,360,879 | 11/1982 | Cameron | 324/142 X |
| 4,401,943 | 8/1983 | Morris | 324/157 |
| 4,535,287 | 8/1985 | Milkovic | 324/142 |
| 4,901,007 | 2/1990 | Sworm | 324/110 |
| 5,198,751 | 3/1993 | Nakamura | 324/141 |
| 5,315,236 | 5/1994 | Lee | 32/157 |

OTHER PUBLICATIONS

Energy Consumption Dec. 1991 Paul Brule Monitor/Radio Electronics Magazine, pp. 31–37.

*Primary Examiner*—Michael Brock

[57] ABSTRACT

A portable power meter is provided for measuring and displaying the real instantaneous power and consumed power of a portable or permanently mounted electrical device. The power meter (10) is provided which can plug into a electric wall socket and is provided with its own socket (14) for receiving the plug of an electrical device. In alternative embodiments, the power meter can be configured to monitor electrical devices which are permanently wired.

1 Claim, 4 Drawing Sheets

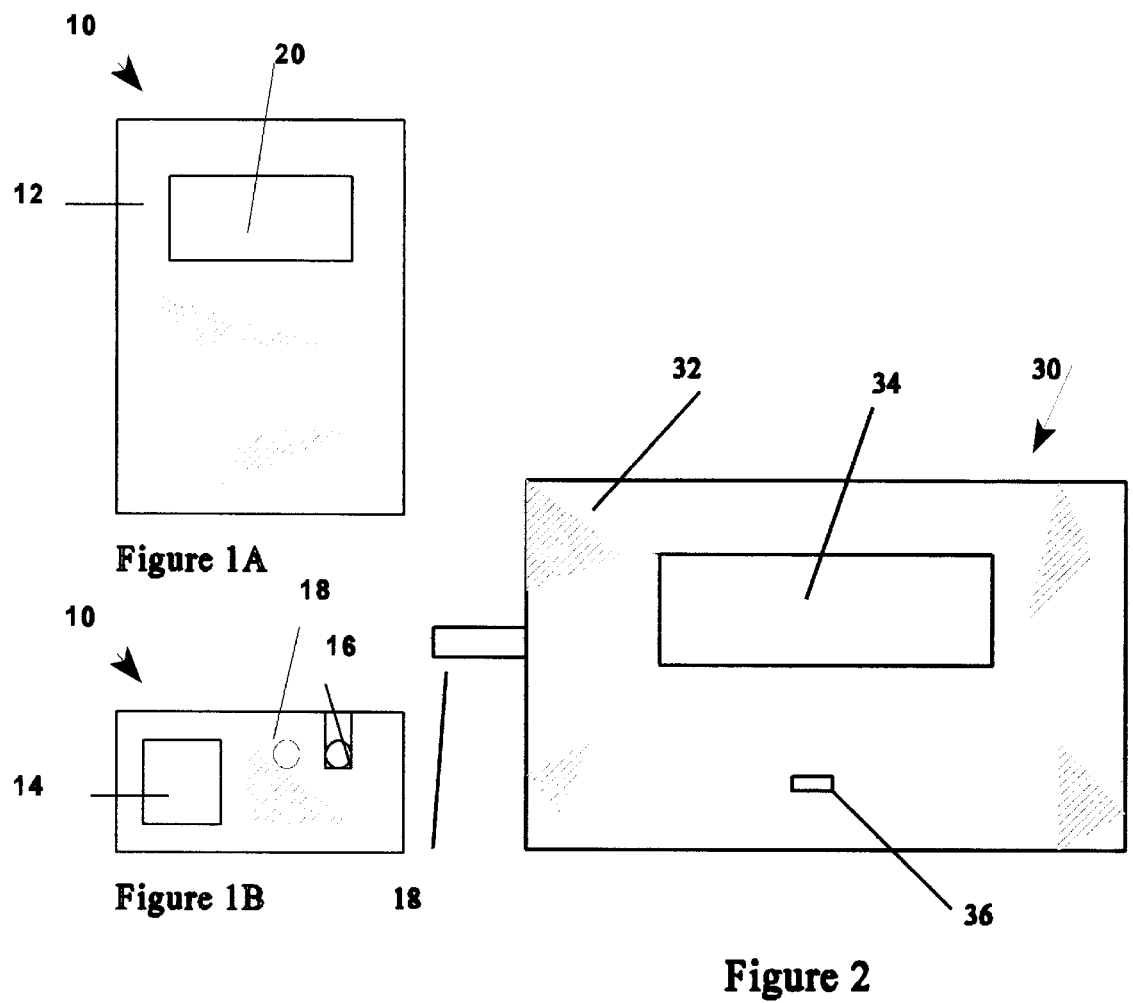

_5,869,960_

DIGITAL POWER CONSUMPTION METER FOR DISPLAYING INSTANTANEOUS AND CONSUMED ELECTRIC POWER OF AN ELECTRICAL DEVICE

FIELD OF THE INVENTION

This invention relates to a meter for measuring real instantaneous and consumed power of an electrical device.

BACKGROUND—DESCRIPTION OF PRIOR ART

Electrical appliances and devices differ widely with respect to the amounts of electricity they consume, which, in turn determines the cost of running the appliances. However, in most cases, the amount of electricity consumed by an appliance is not readily apparent. Many devices are equipped with an information tag which states the power consumption, but this is typically an average or maximum, and does not allow straightforward monitoring of most devices such as solid state TVs which often draw power even when "off". Electrical power consumed by loads which vary such as breadmakers, microwave ovens, dishwashers, compressors, etc, are even more difficult to monitor accurately. In addition, many common appliances utilize reactive elements, such as motors and transformers, which further complicate power measurement since power factor must be taken into account.

It is accordingly an object of the present invention to provide a power meter which readily and accurately provides data regarding the real instantaneous power and consumed power by an electrical device.

The accurate measurement of real power is possible using expensive lab and commercial use type instruments, but these are not very economical or typically designed for easy use by an untrained individual. Several patents have been granted for devices similar to the present invention, however, they share several significant shortcomings. U.S. Pat. Nos. 4,401,943 to Morris (1983) and 5,315,236 to Lee (1994) both disclose devices designed to easily monitor power consumption by electrical devices, however, neither device corrects for power factor, instead reading apparent power. Using either device to monitor the power consumption of a common device such as an air conditioner or refrigerator would present inaccurate results. Neither device displays both instantaneous and consumed power. The device disclosed by Morris is very simple and easy to use, however the display is analog meter which would be hard to accurately interpret over a wide range of values. Lee's device uses a digital display, however, current is sensed by an inductive coil which is expensive, if accurate and sensitive to a wide range of currents. An article in Radio-Electronics, December 1991 issue, by Paul Brule discloses a Energy Consumption Monitor which uses resistive current sensing (for accuracy and span) and corrects for power factor. However, Brules device suffers from excessive heatup of the resistors at high loads, relatively inaccurate measurement of inductive loads, and a relatively high sensing threshold. Furthermore, Brules device uses a transformer to increase the voltage induced across the load resistors. This transformer element results in several disadvantages: The transformer is relatively expensive and bulky and is subject to induced noise from the device's power supply transformer when placed in close proximity. In addition, the device requires additional equipment to monitor instantaneous power.

Thus, the prior art includes devices which include one or more of the following disadvantages:

a) Measure only apparent power, leading to large inaccuracy when measuring reactive devices.

b) Do not display both instantaneous and consumed power.

c) Have poor accuracy and high threshold.

d) Use an inductive element to sense current which is not suitable for low cost and high accuracy.

e) Not designed for easy use.

f) Are not economical to manufacture or purchase.

OBJECTS AND ADVANTAGES

Accordingly, several objects and advantages of the present invention are:

a) to provide a power measuring device which will measure real power;

b) to provide a power measuring device which will display both instantaneous and consumed power;

c) to provide a power measuring device which will have high accuracy and low threshold;

d) to provide a power measuring device which will use resistive elements to sense current;

e) to provide a power measuring device which will is designed for easy use; and f) to provide a power measuring device which will b economical to produce and market.

DRAWING FIGURES

In the drawings, closely related figures have the same number but different alphabetic suffixes.

FIGS. 1A and 1B are front and side views of a power meter according to one embodiment of the invention;

FIG. 2 is a front view of the remote power consumed display assembly;

Figure 3:
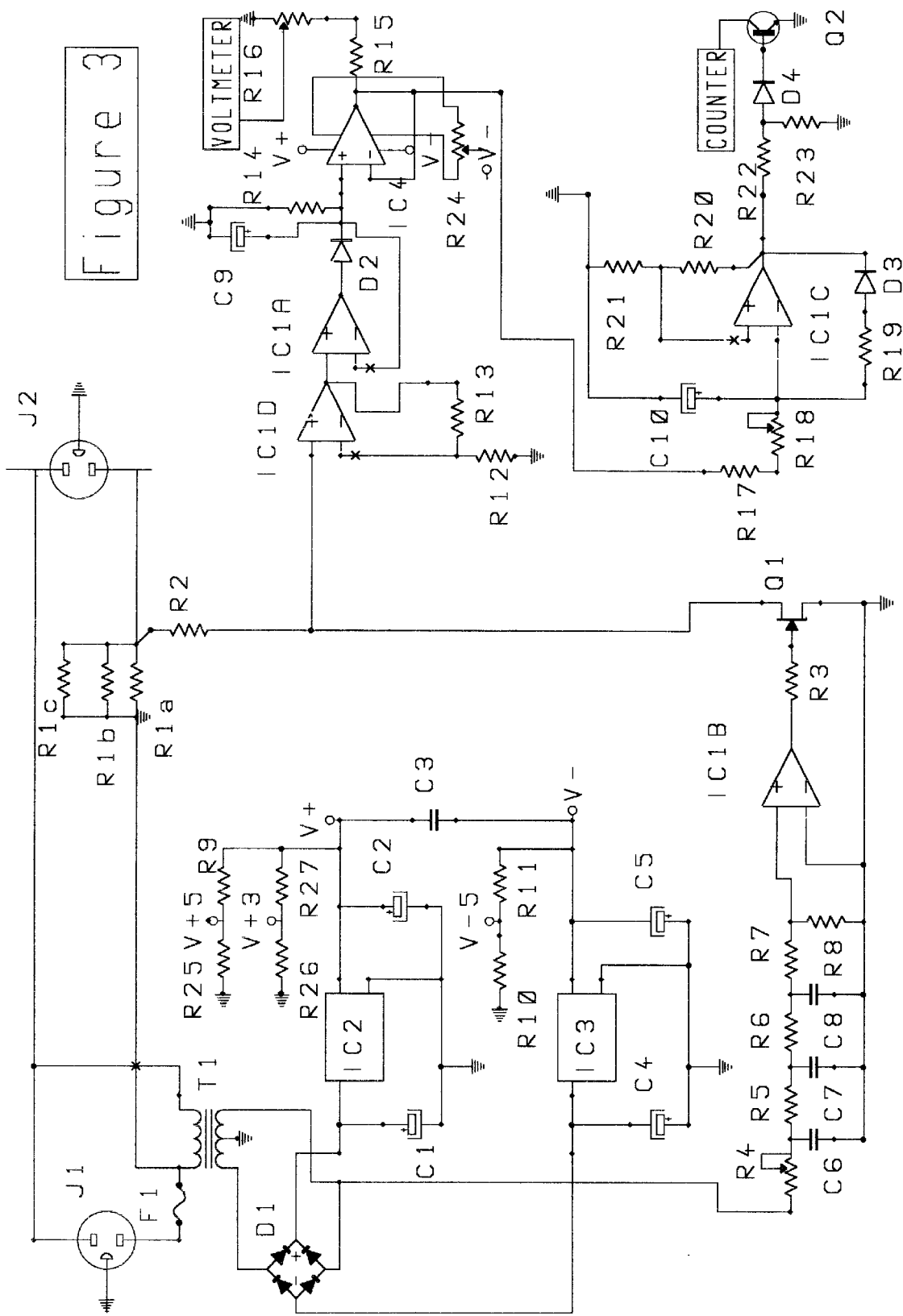
FIG. 3 is a schematic illustration of the electrical circuit of the power meter

With reference to FIGS. 1A to 1B reference numeral 10 generally indicates a power meter comprising a body member 12 provided with an electrical cord 16 for connection to a suitable electric socket (not shown). An electric socket 14 is provided on the side of the body member for receiving the electric plug of an electrical device (not shown). Another electrical cord 18 is also shown which connects to the remote power consumption display shown in FIG. 2. The power meter 10 further is further provided with a single display 20 on the front of the body member 12 which displays instantaneous power.

With reference to FIG. 2, reference numeral 30 generally indicates a remote display assembly comprising a body member 32 provided with an electrical cord 18 for connection to the power meter 10. The remote display 30 further includes a display 34, and a pushbutton 36. Push button 36 functions to reset the display.

The working of the power meter 10 will now be described with reference to FIGS. 3 and 4.

In order to determine the actual power (P) consumed by an electrical device, the voltage (V), current (I), and phase angle (θ) between the voltage and current, must be determined, as shown in the expression which defines real power:

$$P = V \times I \cos \theta$$

where cosθ is known as the power factor. From this expression it is clear that power is proportional to I×cosθ. To obtain the phase angle, θ, both the voltage and current must be monitored. The ensuing discussion describes how the present invention senses the load current and power factor and processes the two to arrive at a signal proportion al to real power.

The circuit is broadly composed of the following seven functions: Power supply for the circuit, load current sensing, phase angle correction, power signal amplification and calibration, a voltage (power) display, a voltage to frequency convertor, and a counter (consumed power) display.

Figure 4:
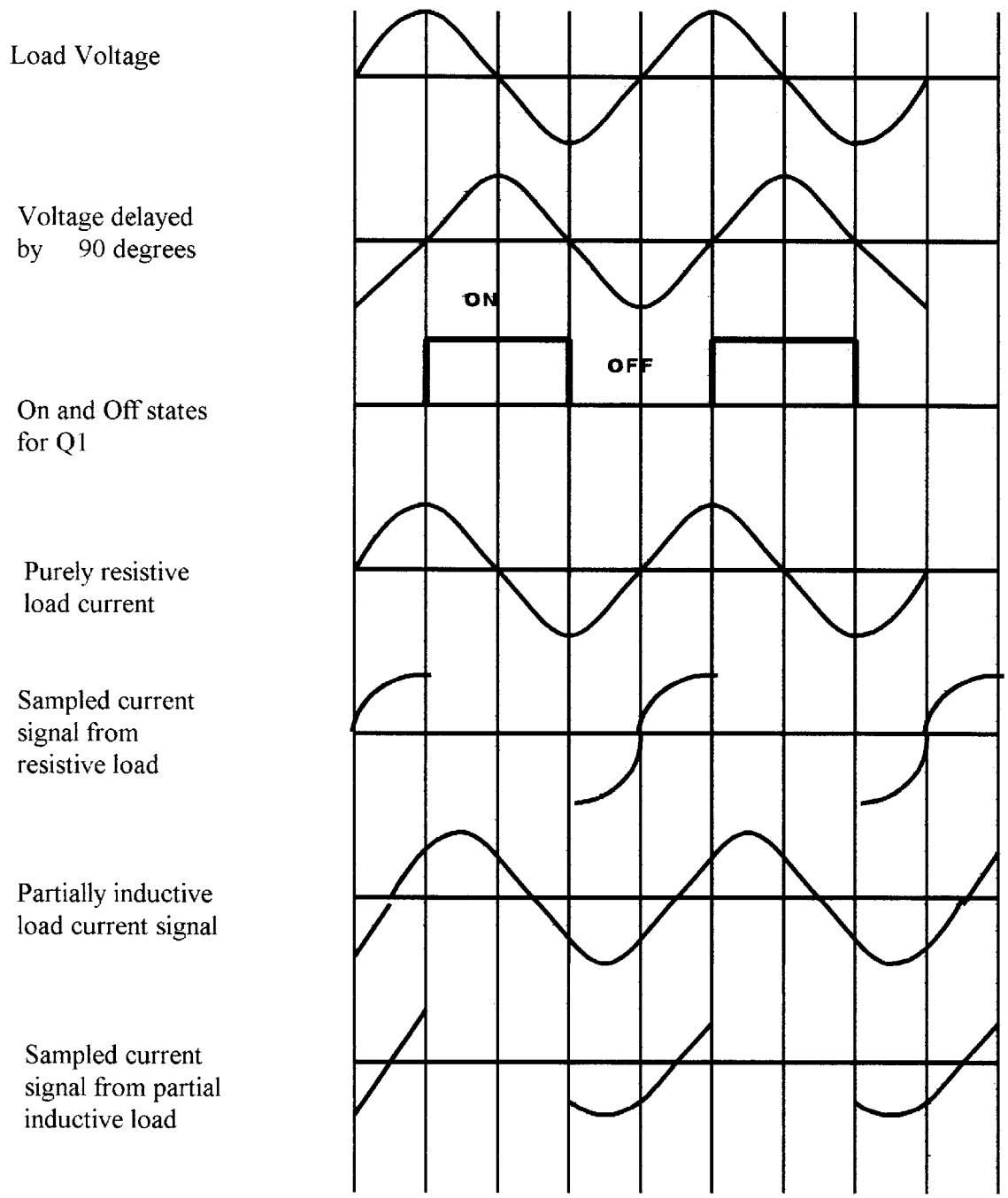
FIG. 4 is an graphical representation of how the power meter measures reactive or resistive loads.

Referring to FIG. 3., R1*a, b, c* are very low resistance power resistors. The current of the load is passed through the resistors. This current results in a proportional voltage which is passed through current limiter resistor R2. R2 is further connected to electronic switch (typically a FET) Q1 and operational amplifier IC1D. Q1 is used to sink the load current developed voltage to ground when it is turned on by an R-C phase shift circuit comprise of R4, 5, 6, 7 and 8 and C6, 7 and 8 and operational amplifier IC1B. The phase shift circuit produces a 90 degree phase delayed voltage wave form from the load supply voltage. Referring to FIG. 4, when the load is purely resistive, the load voltage and current waveforms are in phase, that is the phase angle θ is 0. As the load becomes inductive, the current waveform lags the voltage waveform. Q1 is turned on by a voltage waveform delayed by a fixed 90 degrees, which coincides with the peak current of a resistive load. As the load becomes inductive and shifts relative to the fixed on time of Q1, the voltage sensed by the operational amplifier IC1D decreases, thus properly compensating for power factor.

The operation of the phase angle correction portion of the circuit will now be described: The voltage wave form supplied to the load is delayed by 90 degrees using a conventional R-C circuit comprised of R4, 5, 6, 7 and 8, and C6, 7 and 8. Potentiometer R4 is used to adjust the exact phase shift. Operational amplifier IC1B is used in an open loop comparator configuration to provide a square wave output of the delayed voltage waveform. This ensures that the on and off switching of the Q1 is crisp, which is necessary in order to minimize error. A FET is typically used as it provides the low noise characteristics necessary to accurately sense very low load currents. R3 limits the FET gate current, further lowering noise at the source/drain.

Operational amplifier IC1D is utilized as a non-inverting amplifier, comprised of operational amplifier IC1D and resistors R12 and 13. The output of operational amplifier IC1D is then connected to the non-inverting input of operational amplifier IC1A which is configured as a peak detector consisting of IC1A, D2, R14, and C9. The peak voltage is stored in C9 and is connected to operational amplifier IC4 which is configured as a unity gain follower. Operational amplifier IC4 includes a null offset feature comprised of potentiometer R24 which is used for zero setting.

The output of operational amplifier IC4 is then connected to an adjustable voltage divider comprised of R15 and potentiometer R16. The output of the voltage divider is then connected to a digital voltmeter of conventional design (not shown), calibrated in power units (typically watts).

The output of operation amplifier IC4 is also connected to a voltage to frequency convertor comprised of R17, 18, 19, 20 and 21, D3, C10 and operational amplifier IC1C. The output of IC1C is a square wave with a frequency proportional to the DC voltage output of IC4. These pulses are counted to provide a display of power consumed units (typically kilowatt-hours). The counter is comprised of R22 and 23, D4, transistor Q2 and remote counter display 30. The remote counter display (not shown) contains a divide by n counter, which when used in conjunction with a relatively high frequency to voltage ratio, provides accurate consumed power indication over a wide range of power.

The DC power used to run the electronics is derived from the AC lines. As seen in the schematic, the power transformer T1 is used to step down the line voltage. This is then rectified, filtered and regulated by diode bridge D1, C1, 2, 3, 4 and 5, and integrated circuit regulators IC2 and 3, which provide high and low power supply voltage rails. Resistors R9, 10, 11, 25, 26, and 27, are used as voltage dividers to supply the voltmeter and counter modules. A well regulated and clean power supply is essential to meter output accuracy and sensitivity.

Figure 5:
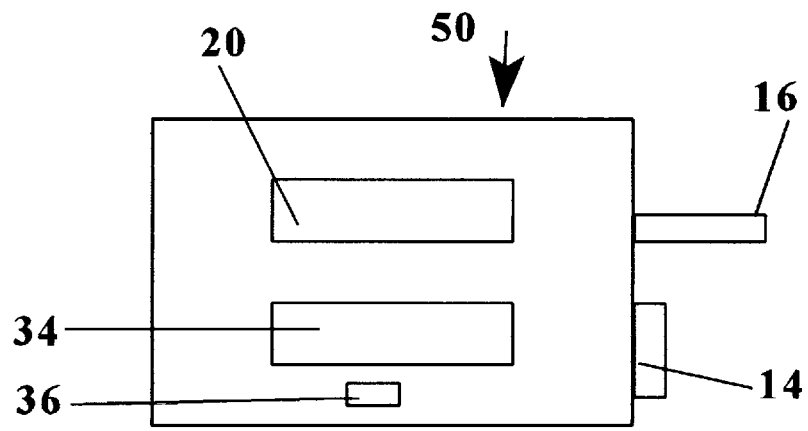
FIG. 5 is a front view of a power meter according to yet another embodiment.
Figure 6:
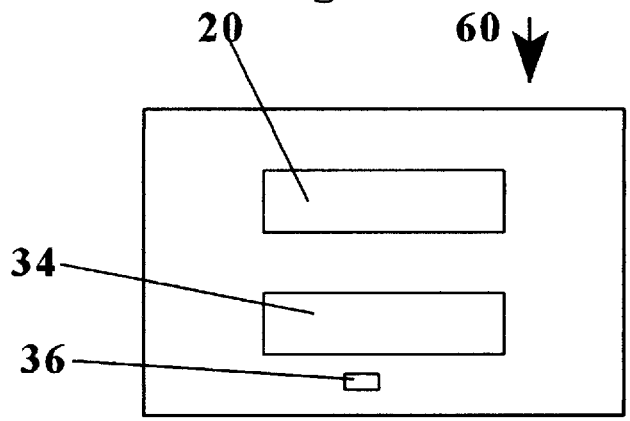
FIG. 6 is a front view of a power meter according to yet another embodiment.
Figure 7:
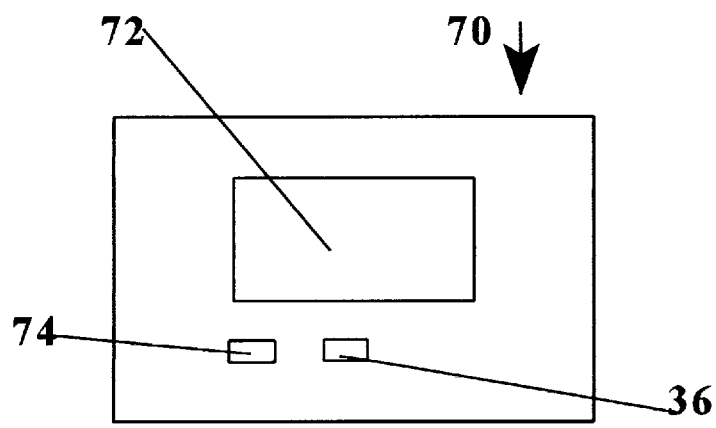
FIG. 7 is a front view of a power meter according to yet another embodiment.

With reference to FIGS. 5, 6, and 7, alternative embodiments, generally indicated by reference numerals 50 and 60, and 70 are shown. The power meters 50, 60, and 70 all operate in a fashion similar to that of power meter 10 combined with 30.

FIG. 5 refers to a power meter 50 in the form of a single enclosure with both instantaneous and consumed power displayed. FIG. 6 refers to a power meter 60 which is similar to power meter 50, however, it is in a configuration which allows it to be permanently mounted and wired. Such a configuration would be desirable when the power consumption of permanently wired devices such as a water pump, furnace or hotwater heater is to be measured. FIG. 7 refers to a power meter 70 which incorporates a single display 72 which can simultaneously or alternately display instantaneous and consumed power. Switch 74 can be used to switch displays, and switch 36 used to reset the display. Power meter 70 could be configured as a portable device as in 50 or a permanently installed device as in 60.

Operation—FIGS. 1, 2

The manner of using the power meter is extremely simple. Power cord 16 is plugged into a convenient outlet. An electrical device is then plugged into the power meter 10 When said electrical device is energized, the instantaneous power and consumed power are displayed. Switch 36 can be operated at any time to reset the power consumed display.

While only preferred embodiments of the invention have been described herein in detail, the invention is not limited thereby, and modifications can be made within the scope of the attached claims.

What is claimed is:

1. An electric power consumption meter circuit for measuring real and consumed power of an electrical load, comprising:

means for connecting the load to a power source which provides a load supply voltage and including a load current sensing resistor connected between the load and the power source, the load current through the resistor resulting in a load current induced voltage;

a FET arranged as an electronic switch and connected through a current limiter resistor to the load current sensing resistor to sink the load current induced voltage when switched on;

an adjustable phase shift circuit connected to produce a 90 degree phase delayed voltage wave form of the load supply voltage;

an open loop comparator connected to the phase shift circuit to provide a square wave output of the delayed voltage wave form to the gate of the FET to provide switching thereof;

an amplifier connected to the current limiter resistor and the FET to produce an amplified output signal;

a voltage peak detector connected to the amplifier to detect the peak voltage of the amplifier output signal;

a voltmeter calibrated in power units for displaying the real power as a function of the peak voltage;

a voltage to frequency convertor for converting the peak voltage to a frequency signal;

a counter calibrated in power consumption units for counting the frequency signal and displaying the total consumed power.

* * * * *